US011693447B2

(12) United States Patent
Wang et al.

(10) Patent No.: US 11,693,447 B2
(45) Date of Patent: *Jul. 4, 2023

(54) CIRCUIT AND METHOD TO SET DELAY BETWEEN TWO PERIODIC SIGNALS WITH UNKNOWN PHASE RELATIONSHIP

(71) Applicant: Rambus Inc., San Jose, CA (US)

(72) Inventors: Robert Wang, Richmond Hill (CA); Zhuobin Li, Markham (CA); Navid Yaghini, Pickering (CA); Hemesh Yasotharan, Toronto (CA); Clifford Ting, Toronto (CA)

(73) Assignee: RAMBUS INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/587,882

(22) Filed: Jan. 28, 2022

(65) Prior Publication Data

US 2022/0221895 A1 Jul. 14, 2022

Related U.S. Application Data

(63) Continuation of application No. 17/273,874, filed as application No. PCT/CA2019/051249 on Sep. 6, 2019, now Pat. No. 11,269,372.

(60) Provisional application No. 62/728,376, filed on Sep. 7, 2018.

(51) Int. Cl.
*G06F 1/12* (2006.01)
*G06F 1/08* (2006.01)
*G06F 1/10* (2006.01)

(52) U.S. Cl.
CPC .................. *G06F 1/12* (2013.01); *G06F 1/08* (2013.01); *G06F 1/10* (2013.01)

(58) Field of Classification Search
CPC ................. G06F 1/12; G06F 1/08; G06F 1/10
See application file for complete search history.

(56) References Cited

U.S. PATENT DOCUMENTS

| 6,675,307 | B1 | 1/2004 | Heitkamp et al. |
| 2007/0241800 | A1 | 10/2007 | Pollock |
| 2010/0066422 | A1 | 3/2010 | Tsai |
| 2016/0077546 | A1 | 3/2016 | Herbeck et al. |

(Continued)

FOREIGN PATENT DOCUMENTS

| EP | 0950285 A1 | 10/1999 |
| WO | WO-2015-116670 A1 | 8/2015 |

OTHER PUBLICATIONS

PCT Search Report and Written Opinion of the International Searching Authority dated Nov. 14, 2019 re: Int'l Appln. No. PCT/CA2019/051249, 5 pages.

(Continued)

*Primary Examiner* — Stefan Stoynov
(74) *Attorney, Agent, or Firm* — Ridout & Maybee LLP

(57) ABSTRACT

A circuit and method are provided for setting a phase relationship between a first signal and a second signal having a known frequency relationship to a master signal but having an unknown phase relationship to each other. One or more phase signals is generated based on the master signal, the phase signals having different phases from each other. One of these phase signals is selected based on the phase of the first signal and a target phase delay between the first signal and second signal. The second signal is generated based on the phase and frequency of the selected phase signal.

20 Claims, 6 Drawing Sheets

(56) References Cited

U.S. PATENT DOCUMENTS

2018/0048319 A1   2/2018  Chae et al.

OTHER PUBLICATIONS

International Preliminary Report on Patentability for International Application No. PCT/CA2019/051249 dated Mar. 9, 2021, 6 pages.

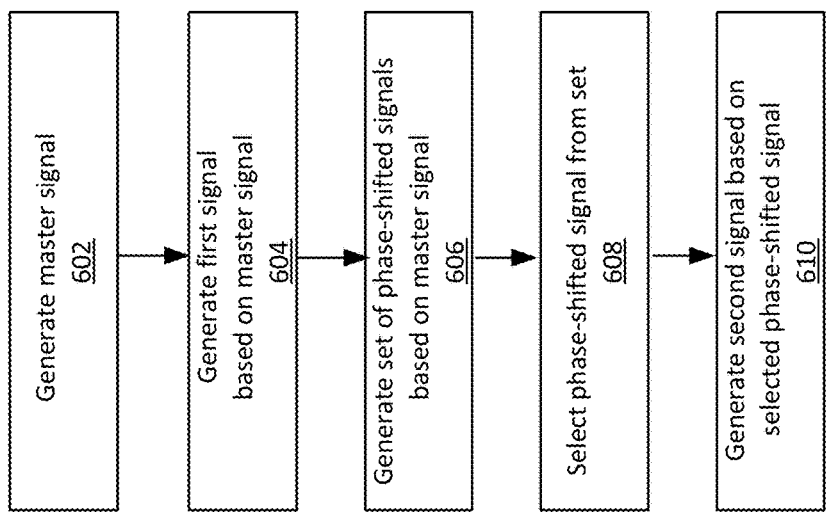
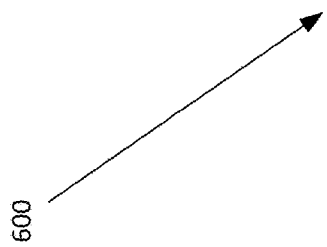
Fig. 6

CIRCUIT AND METHOD TO SET DELAY BETWEEN TWO PERIODIC SIGNALS WITH UNKNOWN PHASE RELATIONSHIP

FIELD

The present disclosure relates to generation of synchronized signals within electronic circuits. In particular, it relates to circuits and methods for setting a programmable delay between two signals having an unknown phase relationship.

BACKGROUND

Digital electronic circuits rely on data and clock signals with a known phase relationship in order to accurately sample data. However, signals with an initially known phase relationship can diverge in their phase as they are subjected to different conditions: for example, a first signal may have a different phase shift when measured at the end of a first path than the phase shift of a second signal measured at the end of a second path. Clock and data recovery circuits are commonly used to recover phase information from a received signal, but these circuits can be costly in terms of die area, power consumption, and latency introduced to the recovered signal.

In particular, in integrated circuits/system design, a control signal such as a clock is used to define a time reference for the movement of signals. Signals having an unknown phase relationship (i.e. an undefined time reference) cannot be processed even if they come from the same source. Errors will be generated in sampling these signals due to the presence of the unknown phase offset between the signals.

The general approach to this problem in integrated circuit design is to use synchronous signals. Two or more synchronous signals are provided, all of which are in sync with a further reference signal (generally a clock signal). The clock signal is used to indicate that the current signals are valid at a given moment in time (i.e. between clock edges). This technique requires a common reference signal or clock signal to be distributed to the entire system. This clock will govern the phase relationship among the various signals used in the design. Each individual circuit within the design cannot operate at its own optimal speed to the extent it relies on signals used in common with other circuits, as the clock signal defines a lowest-common-denominator speed that cannot be exceeded by any individual circuit.

There thus exists a need for a technique for allowing different circuits within a common design to use two or more signals from the same source with different phase offsets, while tracking or defining the delay between these signals, but without the need for these signals to be governed by a common clock signal.

SUMMARY

The present disclosure describes example circuits and methods for identifying and setting a delay between two signals whose phase relationship is unknown.

According to some aspects, the present disclosure describes a circuit for setting a phase relationship between a first signal and a second signal. The first signal and second signal have a known frequency relationship to a master signal but an unknown phase relationship to each other. The circuit comprises a phase signal generator for receiving a master signal and generating one or more output signals based on the master signal, the one or more output signals having different phases from the master signal. The circuit also comprises a phase select logic for receiving an enabling trigger signal having a known phase relationship to the first signal; receiving a target delay signal indicating a target phase delay between the first signal and second signal; and selecting one of the one or more phase signal generator output signals based on the enabling trigger signal and the target delay signal. The circuit also comprises a second signal generator for generating the second signal based on the phase and frequency of the selected phase signal generator output signal.

According to a further aspect which can be combined with other embodiments disclosed herein, the circuit further comprises a phase sampler for sampling the phases of the one or more phase signal generator output signals and sending one or more phase code signals to the phase select logic corresponding to the phases of the one or more phase signal generator output signals.

According to a further aspect which can be combined with other embodiments disclosed herein, the target phase delay comprises a target delay time period, and the phase select logic selects one of the one or more phase signal generator output signals based on the received phase code corresponding to the selected phase signal generator output signal having a transition proximate in time to a transition of the first signal delayed by the target delay time period.

According to a further aspect which can be combined with other embodiments disclosed herein, at least one of the first signal and the second signal is a periodic signal.

According to a further aspect which can be combined with other embodiments disclosed herein, the periodic signal is a clock signal.

According to a further aspect which can be combined with other embodiments disclosed herein, at least one of the first signal and second signal is a periodic bit sequence signal.

According to a further aspect which can be combined with other embodiments disclosed herein, the periodic bit sequence signal is a pseudo-random bit sequence signal.

According to a further aspect which can be combined with other embodiments disclosed herein, the first signal has a frequency that is the same or different from a frequency of the second signal.

According to a further aspect which can be combined with other embodiments disclosed herein, the circuit further comprises a synchronizing logic for receiving the selected phase signal generator output signal; receiving a reset signal; and sending an enable signal based on the reset signal to the second signal generator. The second signal generator generates the second signal in response to receiving the enable signal.

According to a further aspect which can be combined with other embodiments disclosed herein, the phase select logic generates the reset signal, the reset signal having a phase based on the phase of the enabling trigger signal, in response to selecting a phase signal generator output signal.

According to a further aspect which can be combined with other embodiments disclosed herein, the circuit further comprises a first signal generator for generating the first signal based on the master signal.

According to a further aspect which can be combined with other embodiments disclosed herein, the circuit further comprises a master control logic for receiving the first signal; generating the enabling trigger signal with a phase based on the phase of the first signal; and generating the target delay signal.

According to a further aspect which can be combined with other embodiments disclosed herein, the target phase delay of the target delay signal is at least in part predetermined.

According to a further aspect which can be combined with other embodiments disclosed herein, the target phase delay of the target delay signal is at least in part programmable.

According to a further aspect which can be combined with other embodiments disclosed herein, the present disclosure describes a method for setting a phase relationship between a first signal and a second signal, the first signal and second signal having a known frequency relationship to a master signal but having an unknown phase relationship to each other. The method comprises generating one or more phase signals based on the master signal, the one or more phase signals having different phases from the master signal; selecting one of the one or more phase signals based on the phase of the first signal and a target phase delay between the first signal and second signal; and generating the second signal based on the phase and frequency of the selected phase signal.

According to a further aspect which can be combined with other embodiments disclosed herein, the method further comprises sampling the phases of the one or more phase signals; and generating one or more phase code signals corresponding to the phases of the one or more phase signals, wherein the selection of one of the one or more phase signals is based on its corresponding phase code.

According to a further aspect which can be combined with other embodiments disclosed herein, the target phase delay comprises a target delay time period; and the selection of one of the one or more phase signals is based on the phase code corresponding to the selected phase signal having a transition proximate in time to a transition of the first signal delayed by the target delay time period.

According to a further aspect which can be combined with other embodiments disclosed herein, at least one of the first signal and the second signal is a periodic signal.

According to a further aspect which can be combined with other embodiments disclosed herein, the periodic signal is a clock signal.

According to a further aspect which can be combined with other embodiments disclosed herein, at least one of the first signal and second signal is a periodic bit sequence signal.

According to a further aspect which can be combined with other embodiments disclosed herein, the periodic bit sequence signal is a pseudo-random bit sequence signal.

According to a further aspect which can be combined with other embodiments disclosed herein, the first signal has a frequency that is different from a frequency of the second signal.

According to a further aspect which can be combined with other embodiments disclosed herein, the second signal is generated in response to receiving an enable signal.

According to a further aspect which can be combined with other embodiments disclosed herein, the method further comprises generating the enable signal in response to selecting a phase signal.

According to a further aspect which can be combined with other embodiments disclosed herein, the method further comprises generating the first signal based on the master signal.

According to a further aspect which can be combined with other embodiments disclosed herein, the method further comprises generating the enabling trigger signal with a phase based on the phase of the first signal; and generating a target delay signal, wherein selecting one of the one or more phase signals based on the phase of the first signal and a target phase delay between the first signal and second signal comprises selecting one of the one or more phase signals based on the phase of the enabling trigger signal and the target delay signal.

According to a further aspect which can be combined with other embodiments disclosed herein, the target phase delay of the target delay signal is at least in part predetermined.

According to a further aspect which can be combined with other embodiments disclosed herein, the target phase delay of the target delay signal is at least in part programmable.

BRIEF DESCRIPTION OF THE DRAWINGS

Reference will now be made, by way of example, to the accompanying drawings which show example embodiments of the present application, and in which:

FIG. 6 is a flowchart showing steps of an example method for setting a delay between two signals according to embodiments described herein.

Similar reference numerals may have been used in different figures to denote similar components.

DESCRIPTION OF EXAMPLE EMBODIMENTS

The present disclosure describes example circuits and methods for detecting or setting a phase offset between two or more signals. In the described examples, the signals have a known frequency relationship, for example because they originate from the same source. The described examples allow for different sub-systems of an overall circuit or system to operate asynchronously with respect to each other most of the time, with synchronization imposed on two or more sub-systems temporarily and locally only where needed. The overall circuit thus avoids the need to propagate a single clock to every subsystem via a clock tree to maintain constant, global synchronization. By using temporary, local synchronization instead of constant, global synchronization, not only can each sub-system operate locally at its own optimal speed, but the overall circuit may also realize power savings by avoiding the need to propagate a uniform clock signal to every subsystem.

In the described examples, two asynchronous signals (signal0 and signal1) are employed, but other examples may employ more than two asynchronous signals. The asynchronous signals are described as originating from the same master source, such as a master oscillator, which defines a master frequency for the asynchronous signals; this master frequency may be altered in one or more of the asynchronous signals (such as by the use of frequency dividers), but the common derivation from a master frequency results in the asynchronous signals all having known frequency relationships with each other. Other examples may achieve known frequency relationships among the asynchronous signals in different ways.

In the described examples, a first signal (signal0) is generated by a signal generator and used by control logic to sample a set of outputs of a single or multiphase signal generator. The feedback from the sampler is used to select a phase output from this single or multiphase signal generator to generate the second signal (signal1) which has a programmable phase relationship with the first signal.

Figure 1:
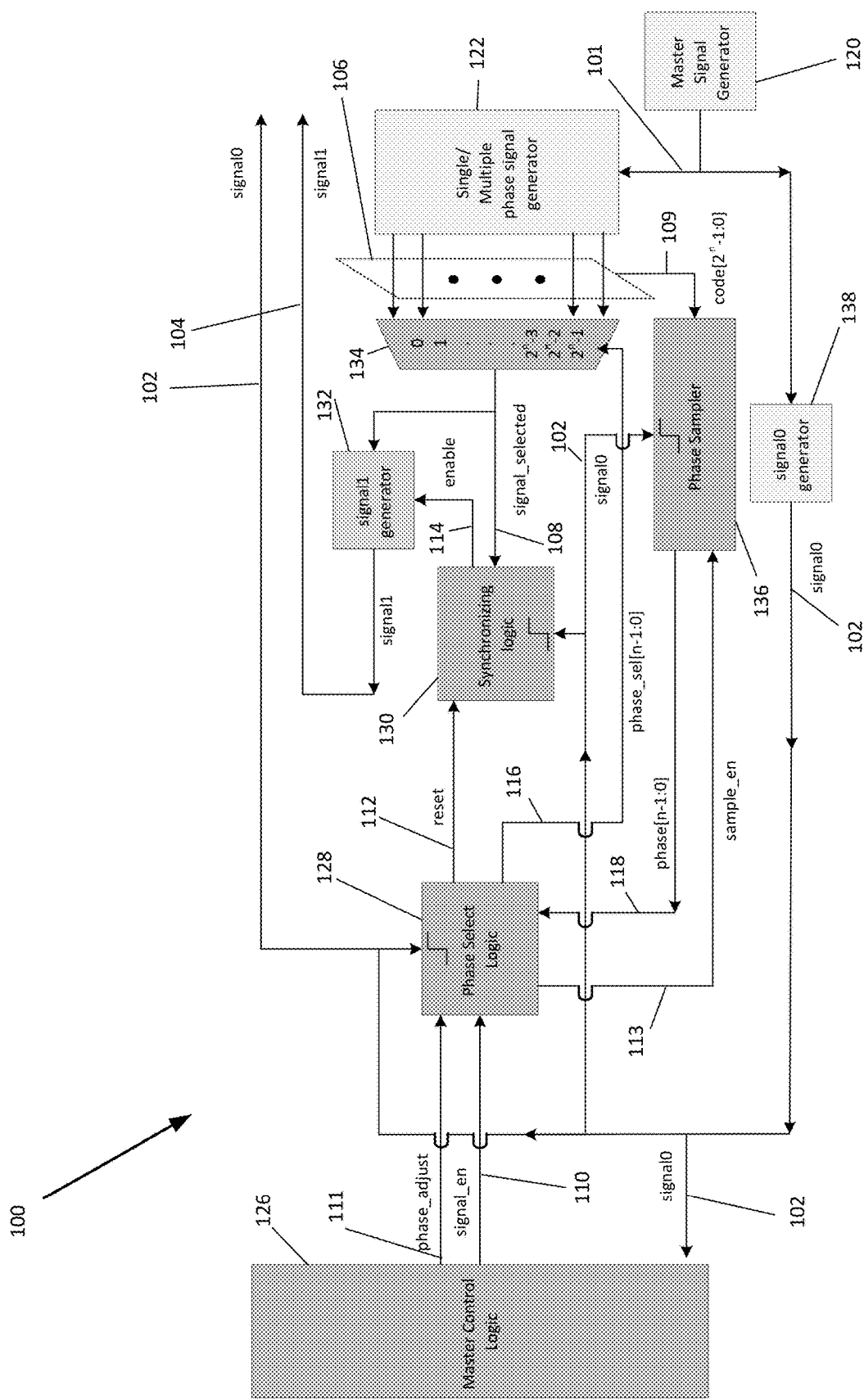
FIG. 1 is a block diagram showing an example circuit for setting a delay between two signals, signal0 and signal1.

With reference to the drawings, FIG. 1 shows a block diagram of an example circuit 100 for setting a programmable delay between two signals having an unknown phase relationship. A master signal generator 120 generates or propagates a master signal 101 to a first signal generator block 138 to generate a first signal, signal0 102. The master signal generator 120 also provides the master signal 101 to a Single/Multiple Phases Signal Generator (SMPSG) 122, which generates a set 106 of n output signals constituting one or multiple versions of the master signal 101 having various phase offsets. A second signal, signal1 104, is generated by a second signal generator block 132 based on a selected signal from the set 106 of output signals of the SMPSG 122 (also referred to herein as phase signals).

In the described examples, the first signal generator block 138 and second signal generator block 132 generate the two asynchronous signals signal0 102 and signal1 104 respectively based at least in part on the master signal 101 or a phase-shifted version thereof generated by the SMPSG 122. The first signal generator block 138 and/or second signal generator block 132 may in various examples use frequency dividers, pseudo-random binary sequence (PRBS) generators, and/or other components to generate the asynchronous signals 102,104. However, because both blocks 138,132 generate the asynchronous signals 102,104 based on this common master signal 101, the two asynchronous output signals 102,104 have a known frequency relationship.

Figure 2:
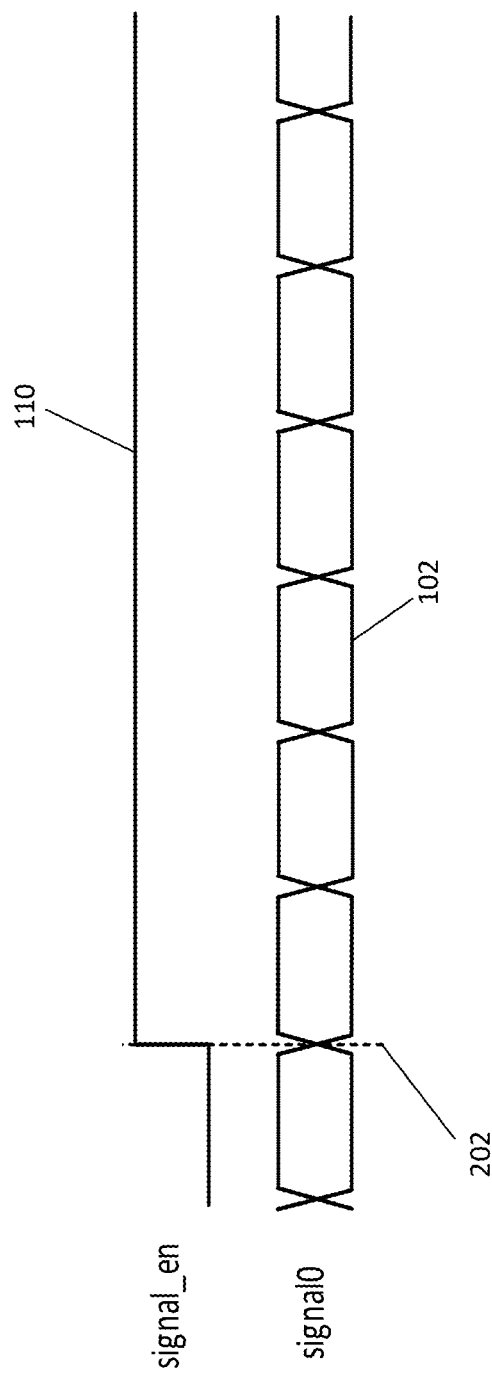
FIG. 2 is a graph of signal amplitude over time for signal0 and signal_en in the example embodiment of FIG. 1.

An enabling trigger signal, signal_en 110, is generated by a Master Control Logic block 126. The Master Control Logic block 126 receives signal0 102 as an input, using it to ensure that signal_en 110 is phase-aligned to signal0 102, as shown in FIG. 2: the edges of signal0 102 align at time 202 to the edge of the triggering of signal_en 110, shown here as an upward step function.

The upward step of signal_en 100 at time 202 triggers the Phase Selection Logic (PSL) block 128 from FIG. 1 to produce a sample_en signal 113. A Phase Sampler (PSMPL) 136 receives signal0 102 and the sample_en signal 113 as inputs; the sample_en signal 113 enables the Phase Sampler (PSMPL) 136 to use signal0 102 to sample the one or multiple phases (designated code[$2^n$-1:0] 109) of the set 106 of signals generated by the SMPSG 122, returning one or multiple phase information signals phase[n-1:0] 118. This one or multiple phase information signals phase[n-1:0] 118 is fed back to the Phase Selection Logic block 128 to determine which phases of the set 106 of signals from the SMPSG 122 is aligned with signal0 102, as shown in FIG. 3.

Figure 3:
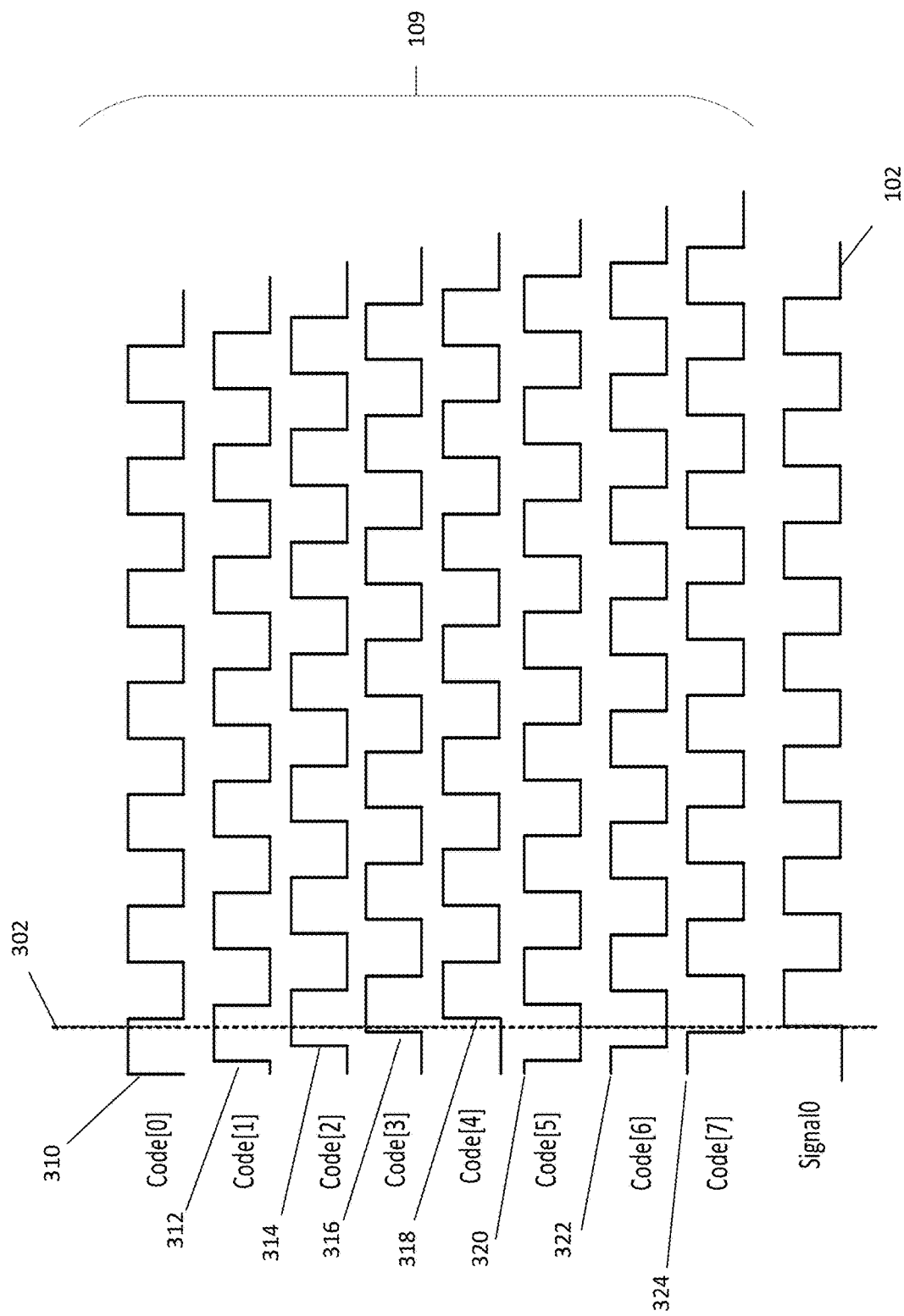
FIG. 3 is a graph of signal amplitude over time for signal0 and the eight phase code signals Code[0] to Code[7] in the example embodiment of FIG. 1.

FIG. 3 shows an example set of phase codes derived from the set 106 of outputs of the SMPSG 122, and their relationship with signal0 102. The phase codes code[$2^n$-1:0] 109 of the set 106 of SMPSG outputs is here shown as eight phase codes of varying phase offsets: code[0] 310, code[1] 312, code[2] 314, code[3] 316, code[4] 318, code[5] 320, code[6] 322, and code[7] 324. This corresponds to a set 106 of three SMPSG 122 output signals: n=3, so code[$2^n$-1:0] 109 is code[$2^3$-1:0] or code[7:0].

The Phase Selection Logic block 128 scans code[$2^n$-1:0] 109 and searches for a code index X (between 0 and 7 in our 8-code example shown in FIG. 3) for which code[X:X-1] is equal to 2'b01, i.e., for which code[X] is at bit value 0 and code[X-1] is at bit value 1, indicating that a rising edge of the code pattern falls between code indices X and X-1. As shown in FIG. 3, for example, where n=3 and code[7:0] sampled by signal0 102 is equal to 8'b00001111, the 2'b01 pattern is located at code[4:3], i.e. between code[4] 318 and code[3] 316. Therefore, in the example of FIG. 3, signal0 102 is aligned within the phase[3] and phase[4] of the phase[n-1:0] signals 118 from the PSMPL 136.

Thus, the higher the value of n (i.e. the greater the number of phase-varying signals produced in the set 106 of outputs from the SMPSG 122), the greater the resolution of the phase detection/phase setting function of the circuit 100 and the more precisely the phase relationship between signal0 102 and signal1 104 can be defined.

In some examples, instead of comparing the timing of rising edges between signal0 102 and the code[$2^n$-1:0] 109 phase codes, a falling edge or other transition of one signal or the other, or both, may be compared.

After determining the phase relationship between signal0 and the set 106 of outputs of the SMPSG 122, a signal can be selected from the set 106 of SMPSG 122 output signals to generate the second signal signal1 104.

The delay between signal0 102 and signal1 104 is determined by a normalized target delay with respect to the signal period. This delay is set by a phase relationship control signal, phase adjust 111 generated by the Master Control Logic 126—it may be either predetermined or dynamically programmable depending on the needs of the current application. In general, the phase_sel[n-1:0] 118 signals are determined by the current phase index X, the phase adjust signal 111, and the total number of phases available in the SMPSG 122. Phase_sel[n-1:0] 116 is set to the sum of X and the normalized delay (set by the phase adjust signal 111) multiplied by $2^n$ modulo $2^n$. Phase_sel[n-1:0] 116 is received by a multiplexer 134 and used to select one of the set 106 of outputs of the SMPSG 122 to use as the multiplexer output signal_selected 108.

Figure 4:
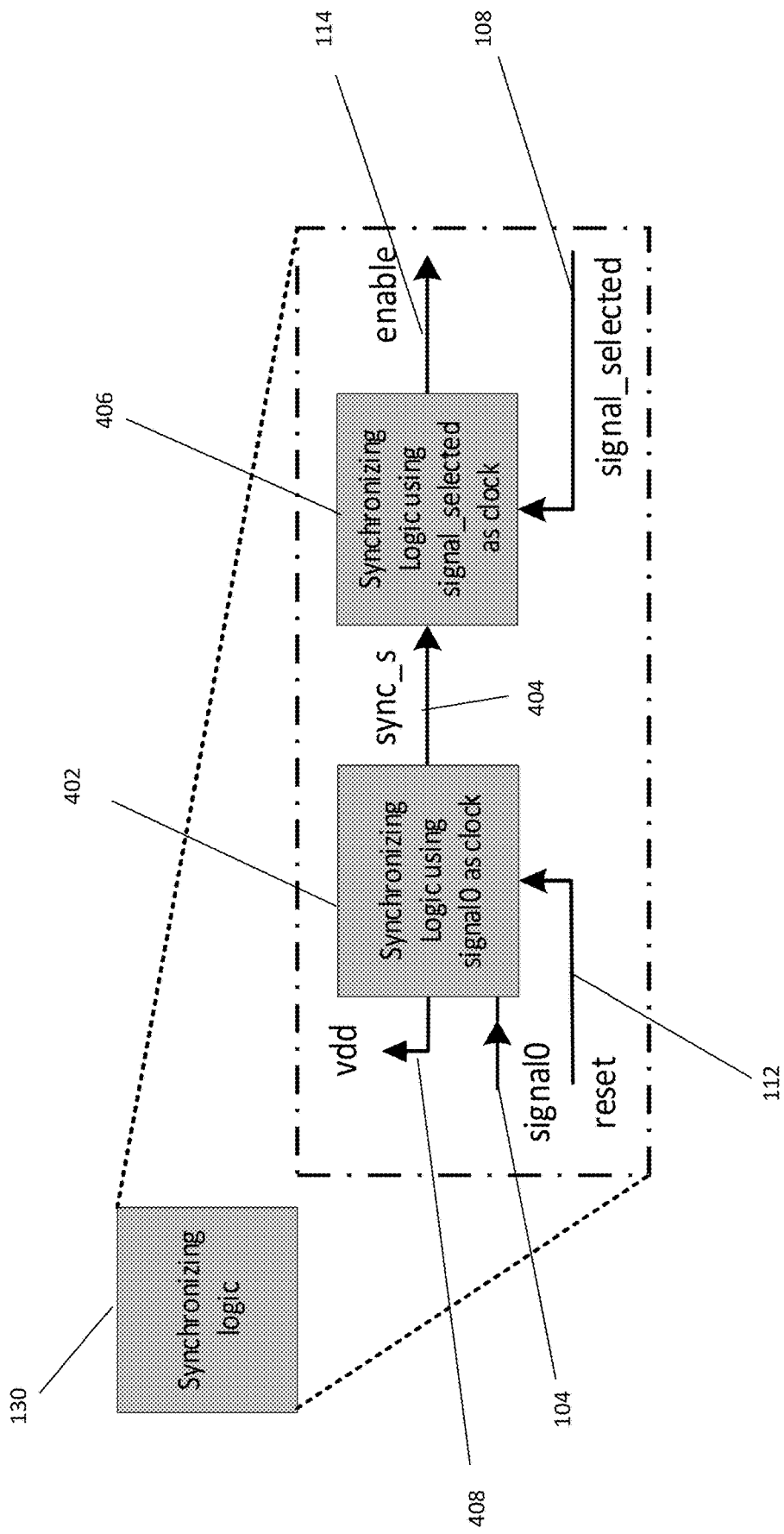
FIG. 4 is a block diagram showing a detailed view of the Synchronizing Logic block of the example embodiment of FIG. 1.

Once the PSL 128 determines the phase which should be used to generate signal1 104, it de-asserts a reset signal 112 to the signal1 generation block shown as second signal generator block 132 in FIG. 1. The reset signal 112 from the PSL 128 is passed to the Synchronizing Logic (SL) 130, which is shown in greater detail in FIG. 4. As shown in FIG. 4, there are two parts to the synchronizing logic 130. The first block 402 uses signal0 as a clock to synchronize the reset signal 112 (using a vdd drain 408). The synchronized reset output, sync_s 404, is passed to a second stage synchronizing logic block 406 using the signal_selected signal 108 coming from the SMPSG 122 and selected by the PSL 128 via the multiplexer 134. The second stage synchronization logic block 406 generates an enable signal 114 which is aligned to the signal_selected signal 108. The delay from de-assertion of reset 112 to the assertion of enable 114 is determined by the implementation and it is labelled as $t_{sync}$ 504. The implementation of the second signal generator block 132, is such that second signal signal1 104 will be generated a period of time $t_{gen}$ 506 after the enable signal 114 being asserted. Both $t_{gen}$ 506 and $t_{sync}$ 504 are implementation-specific and may vary from one embodiment to another based on the system design. Once $t_{gen}$ 506 and $t_{sync}$ 504 are determined, phase_sel 116 accounts for the additional delay in the existing system. The normalized delay in the phase_sel 116 generation by the PSL 128 needs to subtract the $t_{sync}$ 504 and $t_{gen}$ 506 from the target delay $t_{delay}$ 502. The sum of X and the adjusted normalized delay multiplied by $2^n$ modulo $2^n$ is used to set the phase_sel 116 control which enables signal1 104 to be generated with a known phase relationship with signal0 102.

Figure 5:
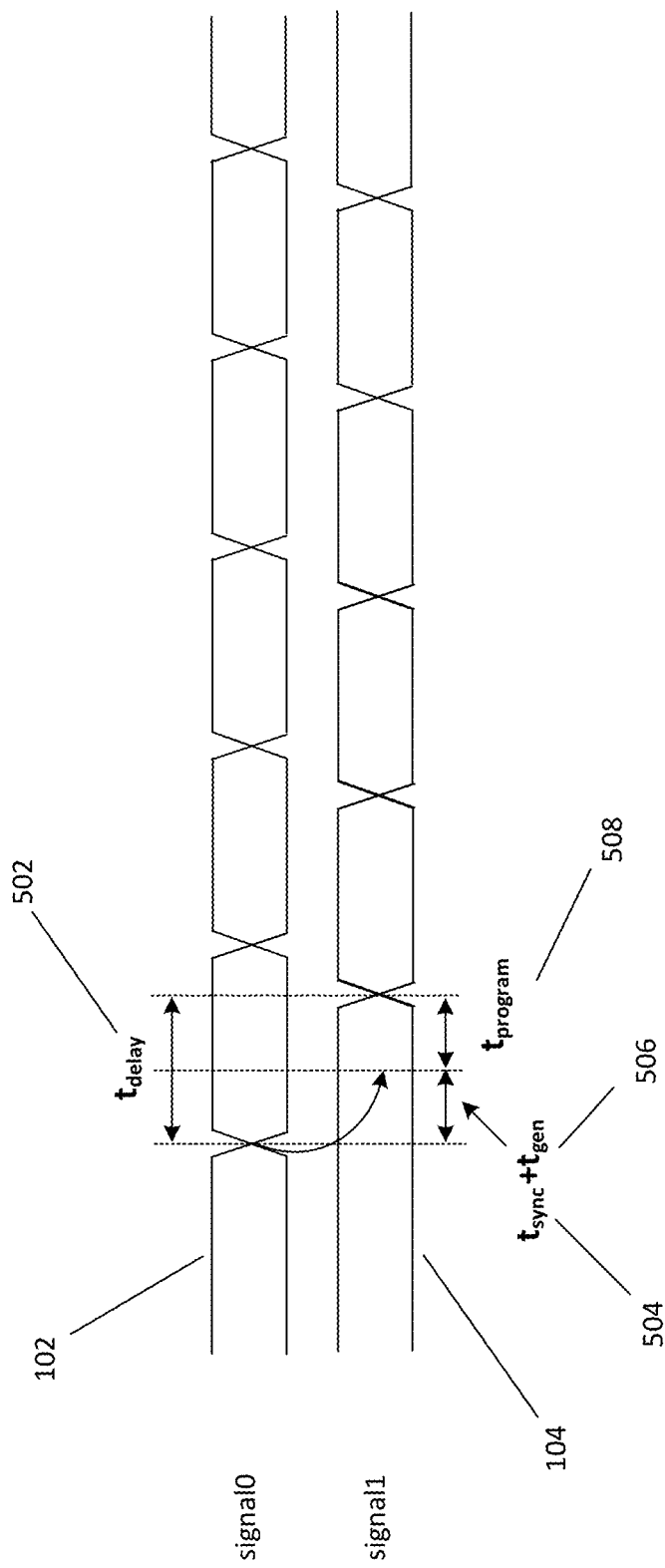
FIG. 5 is a graph of signal amplitude over time for signal0 and signal1 in the example embodiment of FIG. 1.

FIG. 5 shows the expected outputs, signal0 102 and signal1 104. The programmable delay amount $t_{program}$ 508 added to the sum of $t_{sync}$ 504 and $t_{gen}$ 506 is equal to the total target delay $t_{delay}$ 502. Thus, the target delay $t_{delay}$ 502 may not be lower than of $t_{sync}$ 504 plus $t_{gen}$ 506.

FIG. 6 shows an example method 600 for setting a phase relationship between two signals having an unknown phase relationship. At step 602, the master signal 101 is generated (e.g. by the master signal generator 120). At step 604, the first signal 102 is generated based on the master signal 101 (e.g. by first signal generator 138 receiving the master signal 101 as an input). At step 606, a set 106 of one or more phase-shifted signals is generated based on the master signal 101 (e.g. by the SMPSG 122). At step 608, one phase-shifted signal 108 is selected from the set 106 (e.g. as a result of the target delay $t_{delay}$ 502 set by the phase select logic 128, based on phase information 118 from the sampler 136 and control signals phase adjust 111 and signal_en 110 from the master control logic 126 using the first signal 102 as a clock input). Once the phase-shifted signal 108 has been selected at step 608, the second signal 104 is generated at step 610 based on the phase-shifted signal 108 (e.g. by the second signal generator 132 in response to an enable signal 114 input from the synchronizing logic 130).

The described examples may be applied to a number of problem domains.

In one example embodiment, the asynchronous signals 102,104 may be clock signals or other periodic signals having different frequencies. Each clock signal may govern one or more different sub-systems operating at different speeds based on the capabilities of those sub-systems. For example, in one embodiment the master signal 101 may be a clock signal or other periodic oscillating signal with a frequency of 500 MHz; the first signal 102 may be a clock signal operating at 100 MHz (due to a ⅕ frequency divider in the first signal generator 138), while the second signal 104 may be a clock signal operating at 50 MHz (due to a ¹⁄₁₀ frequency divider in the second signal generator 132). These asynchronous signals 102,104 may each govern its own sub-system, which can operate asynchronously at different speeds. The second signal 104 is generated with a known phase relationship to the first signal 104, allowing the two sub-systems governed by the two signals 102,104 to interoperate as needed.

In another embodiment, the asynchronous signals 102, 104 carry data, such as pseudo-random binary sequence (PRBS) data or other periodic bit sequence data. The first signal generator 138 and second signal generator 132 may each include a PRBS generator that generates PRBS data based on input seed data. Each of the asynchronous signals 102, 104 may be used to provide PRBS data to different subsystems while maintaining a known phase relationship to each other, allowing the subsystems to interoperate as needed.

The described circuit 100 thereby enables the interoperation within a single overall system of two signals with an unknown phase relationship due to their use within different subsystems or blocks of the overall system. This minimizes the impact of the unknown phase relationship between the two signals and allows faster operation of the overall system. For example, if each of the subsystems is capable of running at up to 1 GHz by itself, but the unknown phase difference between the two signals is potentially as high as 5 ns, then the overall system can only run at up to 200 MHz, as the two signals need to work with each other and so must be governed by a clock that accounts for the potential phase difference. However, by employing the circuit 100, the overall system can run at up to 1 GHz.

Although the present disclosure describes methods and processes with steps in a certain order, one or more steps of the methods and processes may be omitted or altered as appropriate. One or more steps may take place in an order other than that in which they are described, as appropriate.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., an embedded processor, a personal computer, a server, or a network device) to execute examples of the methods disclosed herein.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A circuit for setting a phase delay between a first signal and a second signal to a target phase delay, the first signal and second signal having a frequency relationship to a master signal, comprising:
    a phase signal generator for receiving the master signal and generating one or more output signals based on the master signal; and
    a phase select logic for:
        receiving an enabling trigger signal having a phase relationship to the first signal; and
        selecting one of the one or more phase signal generator output signals based on the enabling trigger signal and the target phase delay; and
    a second signal generator for generating the second signal based on the phase of the selected phase signal generator output signal.

2. The circuit of claim 1, wherein the first signal and a second signal have an unknown phase relationship to each other.

3. The circuit of claim 1, wherein each of the one or more phase signal generator output signals has a different phase from the master signal.

4. The circuit of claim 1, wherein:
the phase select logic is further configured to receive a target delay signal indicating the target phase delay; and
selecting one of the one or more phase signal generator output signals based on the enabling trigger signal and the target phase delay comprises:
selecting one of the one or more phase signal generator output signals based on the enabling trigger signal and the target delay signal.

5. The circuit of claim 1, wherein:
the second signal generator generates the second signal based on the phase and frequency of the selected phase signal generator output signal.

6. The circuit of claim 1, further comprising a phase sampler for sampling the phases of the one or more phase signal generator output signals and sending one or more phase code signals to the phase select logic corresponding to the phases of the one or more phase signal generator output signals.

7. The circuit of claim 6 wherein:
the target phase delay comprises a target delay time period; and
the phase select logic selects one of the one or more phase signal generator output signals based on the received phase code corresponding to the selected phase signal generator output signal having a transition proximate in time to a transition of the first signal delayed by the target delay time period.

8. The circuit of claim 1, wherein at least one of the first signal and the second signal is a periodic signal.

9. The circuit of claim 8, wherein the periodic signal is a clock signal.

10. The circuit of claim 8, wherein the periodic signal is a periodic bit sequence signal.

11. The circuit of claim 10, wherein the periodic bit sequence signal is a pseudo-random bit sequence signal.

12. The circuit of claim 1, wherein the first signal has a frequency that is different from a frequency of the second signal.

13. The circuit of claim 1, wherein the target phase delay is predetermined or dynamically programmed.

14. The circuit of claim 1, further comprising a synchronizing logic for:
receiving the selected phase signal generator output signal;
receiving a reset signal; and
sending an enable signal based on the reset signal to the second signal generator;
wherein the second signal generator generates the second signal in response to receiving the enable signal.

15. The circuit of claim 14, wherein the phase select logic generates the reset signal, the reset signal having a phase based on the phase of the enabling trigger signal, in response to selecting a phase signal generator output signal.

16. The circuit of claim 1, further comprising a first signal generator for generating the first signal based on the master signal.

17. The circuit of claim 1, further comprising a master control logic for:
receiving the first signal; and
generating the enabling trigger signal with a phase based on the phase of the first signal.

18. The circuit of claim 17, wherein the master control logic is further configured to generate the target delay signal.

19. A method for setting a phase delay between a first signal and a second signal to a target phase delay, the first signal and second signal having a frequency relationship to a master signal, comprising:
generating one or more output signals based on the master signal;
selecting one of the one or more output signals based on the first signal and the target phase delay; and
generating the second signal based on the phase of the selected one of the one or more output signals.

20. The method of claim 19,
further comprising:
receiving a reset signal; and
generating an enable signal based on the reset signal;
wherein the second signal is generated in response to generation of the enable signal.

* * * * *